United States Patent
Sato

(10) Patent No.: US 6,359,474 B1
(45) Date of Patent: Mar. 19, 2002

(54) INPUT INTERFACE CIRCUIT

(75) Inventor: Hisatake Sato, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/533,854

(22) Filed: Mar. 24, 2000

(30) Foreign Application Priority Data

Oct. 12, 1999 (JP) .......................................... 11-288960

(51) Int. Cl.[7] .............................................. H03K 5/153
(52) U.S. Cl. ........................................ 327/81; 327/143
(58) Field of Search ................................. 327/142, 143, 327/198, 80, 81, 77, 170

(56) References Cited

U.S. PATENT DOCUMENTS 4,224,539 A * 9/1980 Musa et al. ................... 327/78
5,675,272 A * 10/1997 Chu .......................... 327/142

* cited by examiner

*Primary Examiner*—Kenneth B. Wells
*Assistant Examiner*—Cassandra Cox
(74) *Attorney, Agent, or Firm*—Volentine Francos, PLLC

(57) ABSTRACT

An input interface circuit which can be used whether the power supply potential is 5 volts or 3 volts. The input interface circuit includes a comparator, a detector and a controller. The comparator compares a potential level of a signal input from a signal input terminal with a predetermined threshold value, and outputs the comparison result from a signal output terminal. The detector detects whether the power supply potential to be supplied to the comparator is 5 volts or 3 volts. The controller changes the threshold value of the comparator when the detection result of the detector is 3 volts, but does not when the detection result is 5 volts. Therefore, the input interface circuit can be operated with an optimum threshold value, whether the power supply potential is 5 volts or 3 volts.

17 Claims, 4 Drawing Sheets

INPUT INTERFACE CIRCUIT

BACKGROUND OF THE INVENTION

1. Field of the Invention

The present invention relates to an input interface circuit disposed in the input stage of a semiconductor integrated circuit.

2. Description of the Related Art

Signals to be input to an input interface circuit are not always in full swing from the power supply potential VDD to the ground potential GND, but may have a high level potential which is lower than the power supply potential VDD. Therefore generally an input interface is designed so as to operate even if the high level potential of the input signal is lower than the power supply potential VDD. For example, the input interface circuit may be designed assuming that the power supply potential VDD is 5 volts and the high level potential of input signals is 2.4 volts.

Normally in an input interface circuit, the threshold value to determine the high level/low level of input signals is set to a mid-value between the low level potential and high level potential. When the high level potential is 2.4 volts, for example, the threshold value is around 1.2–1.6 volts. In other words, in order to create an input interface circuit which power supply potential VDD is 5 volts and the high level potential of input signals is 2.4 volts, each transistor in the input interface circuit is designed such that the threshold value becomes 1.2–1.6V when VDD is 5 volts.

Because of this, the input interface circuit cannot insure normal operation if the power supply potential VDD which is actually used is different from the power supply potential VDD which was assumed during design.

For example, in the case of an input interface circuit where the threshold value becomes 1.2 volts when VDD is 5 volts, the threshold value when VDD is 3 volts becomes lower than 1.2 volts. Therefore the possibility of erroneously recognizing a low level signal as a high level signal increases due to signal noises.

If a 5 volt VDD is supplied to an interface circuit where VDD is designed as 3 volts, on the other hand, the possibility of erroneously recognizing a high level signal as a low level signal increases.

Therefore, only one type of power supply voltage can be used for a conventional interface circuit.

SUMMARY OF THE INVENTION

An object of the present invention is to provide an input interface circuit which can be used with a plurality of types of power supply voltage.

An input interface circuit in accordance with the present invention comprises: means for comparing the potential level of a signal input from a signal input terminal with a predetermined threshold value and outputting the comparison result from a signal output terminal; means for detecting the power supply potential to be supplied to the comparison means; and means for controlling the threshold value of the comparison means according to the power supply potential detected by the detection means.

The input interface circuit of the present invention can change the threshold value of the comparison means according to the power supply potential, so a plurality of types of power supply voltage can be used.

BRIEF DESCRIPTION OF THE DRAWINGS

Other objects and advantages of the present invention will be described with reference to the accompanying drawings.

DESCRIPTION OF THE PREFERRED EMBODIMENTS

Figure 1A:
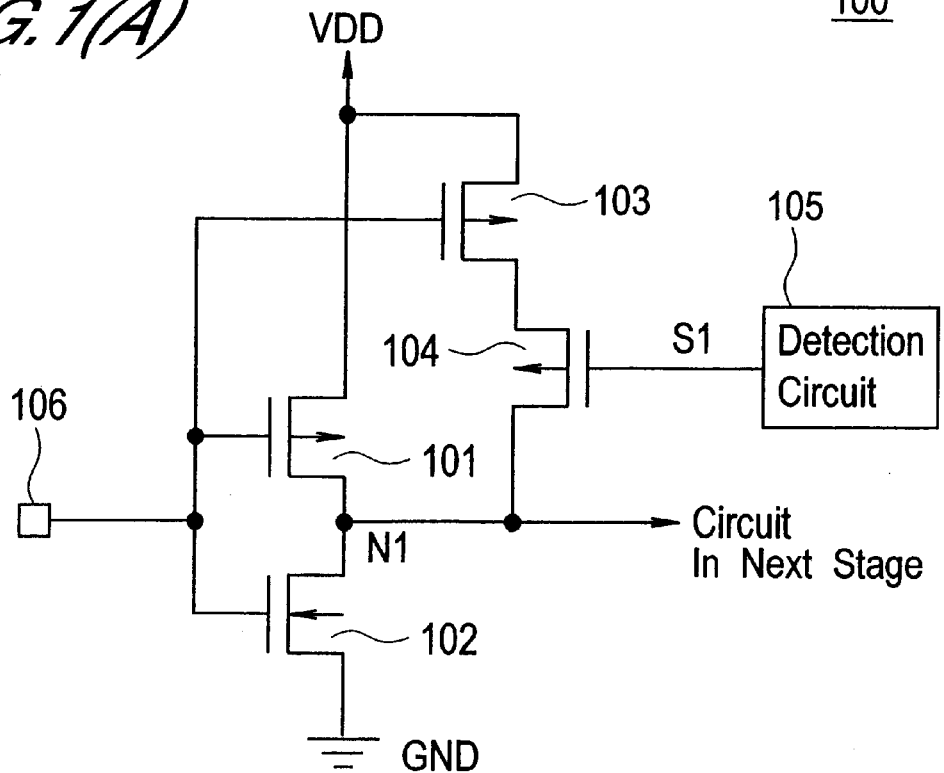
FIG. 1A is a circuit diagram depicting a configuration of an input interface circuit in accordance with a first embodiment.

Embodiments of the present invention will now be described with reference to the accompanying drawings. In the drawings, the size, the shape and the positional relationship of each composing element are roughly shown merely to support understanding, and the numerical conditions described below are merely examples.

First Embodiment

FIG. 1A is a drawing depicting a configuration of an input interface circuit in accordance with a first embodiment of the present embodiment.

The input interface circuit 100 of the present embodiment comprises three pMOS transistors 101, 103 and 104, one nMOS transistor 102, a power supply voltage detection circuit 105 and a signal input terminal 106. As FIG. 1A shows, the potential of the node N1 becomes the voltage signal to be output to the circuit in next stages.

In the pMOS transistor 101, the source is connected to the power supply line VDD, the drain is connected to the node N1, and the gate is connected to the signal input terminal 106.

In the nMOS transistor 102, the source is connected to the ground line GND, the drain is connected to the node N1, and the gate is connected to the signal input terminal 106.

In the pMOS transistor 103, the source is connected to the power supply line VDD, and the gate is connected to the signal input terminal 106.

In the pMOS transistor 104, the source is connected to the drain of the pMOS transistor 103, the drain is connected to the node N1, and detection signal S1 is input from the gate.

The power supply voltage detection circuit 105 detects the value of the power supply potential VDD and outputs a signal S1 which shows the detection result. In this embodiment, the power supply potential VDD is 3 or 5 volts.

Figure 1B:
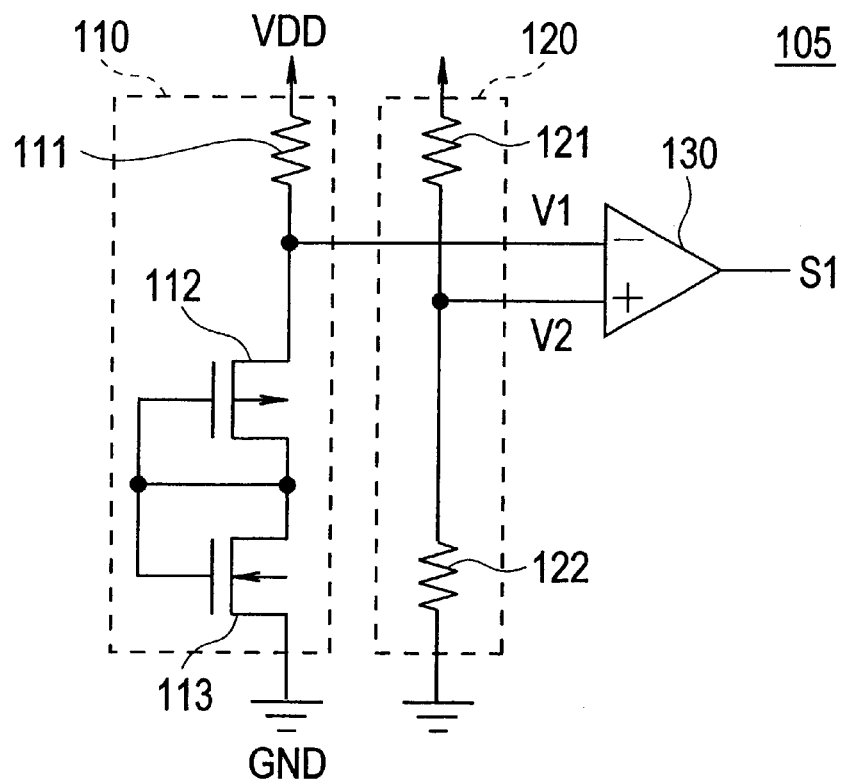
FIG. 1B is a circuit diagram depicting the internal configuration of the power supply voltage detection circuit shown in FIG. 1A.

FIG. 1B is a circuit diagram depicting an example of the internal configuration of the power supply voltage detection circuit 105.

As FIG. 1B shows, the power supply voltage detection circuit 105 comprises a constant voltage circuit 110, a resistance type potential dividing circuit 120 and a comparator 130.

The constant voltage circuit 110 comprises a resistor 111, a pMOS transistor 112 and an nMOS transistor 113. One end of the resistor 111 is connected to the power supply line VDD. The source of the pMOS transistor 112 is connected to the other end of the resistor 111. The gate of the pMOS transistor 112 is connected to the drain of the pMOS transistor 112, the gate of the nMOS transistor 113, and the drain of the nMOS transistor 113. The source of the nMOS transistor 113 is connected to the ground line GND.

The resistance type potential dividing circuit 120 comprises two resisters, 121 and 122, which are connected in a series between the power supply line VDD and the ground line GND.

The comparator 130 inputs the source potential V1 of the pMOS transistor 112 from the minus input terminal, and inputs the potential V2 of the connection point between resistors 121 and 122 from the plus input terminal. The output signal of the comparator 130 is applied to the gate of the pMOS transistor 104 (see FIG. 1A) as a detection signal S1.

Next the operation principle of the input interface circuit 100 will be described.

At first, the detection circuit 105 detects the power supply potential VDD as follows.

The constant voltage circuit 110 always outputs a constant voltage V1 regardless the power supply potential VDD. In this embodiment, V1 is assumed to be 2 volts. The resistance type potential dividing circuit 120 divides the power supply potential VDD according to the resistance ratio of the resistors 121 and 122. In this embodiment, the resistance ratio of the resistors is assumed to be 2:3. So when the power supply potential VDD is 5V, the voltage V2 is 3 volts, and when the power supply potential VDD is 3 volts, the voltage V2 is 1.8 volts. When V2 is greater than V1, the comparator 130 sets the output signal S1 to a high level, and when V2 is smaller than V1, the comparator 130 sets the output signal S1 to a low level. Therefore, when the power supply potential VDD is 5 volts, the output signal S1 of the comparator 130 is at a high level, and when the power supply potential VDD is 3 volts, the output signal S1 is at a low level.

This output signal S1 is input to the gate of the pMOS transistor 104.

When the signal S1 is at a high level, that is, when the power supply potential VDD is 5 volts, the pMOS transistor 104 turns off. Therefore the threshold value of this input interface circuit 100 is determined by the transistors 101 and 102. In this case, the threshold value is determined by the ratio of the on resistance of the pMOS transistor 101 to the on resistance of the nMOS transistor 102. The on resistance is a resistance value between the source and the drain when the transistor is on. As the on resistance of the pMOS transistor 101 becomes smaller than the on resistance of the nMOS transistor 102, the threshold value increases. On the other hand, as the on resistance of the pMOS transistor 101 becomes greater than the on resistance of the nMOS transistor 102, the threshold value decreases. Therefore, an optimum threshold value can be obtained by appropriately setting the on resistance of the transistors 101 and 102. The optimum threshold value is determined according to the high level potential of signals which are input from the terminal 106.

When the signal S1 is at a low level, that is, when the power supply potential VDD is 3 volts, the pMOS transistor 104 turns on. Therefore, the threshold value of this input interface circuit 100 is determined by the transistors 101–104. In this case, the threshold value is determined by the ratio of the combined on resistance of the pMOS transistors 101, 103 and 104 to the on resistance of the nMOS transistor 102. In other words, as the combined on resistance of the pMOS transistors 101, 103 and 104 becomes smaller than the on resistance of the nMOS transistor 102, the threshold value increases. Therefore, an optimum threshold value can be obtained by appropriately setting the on resistance of the transistors 101–104.

Because of the above described reasons, the input interface circuit 100 can independently set the threshold value when VDD is 5 volts and the threshold voltage when VDD is 3 volts. These threshold voltage values need not be the same. For the threshold voltage when VDD is 5 volts, it is preferable to set the optimum value of the input interface circuit with a TTL structure. For the threshold voltage when VDD is 3 volts, on the other hand, it is preferable to set the optimum value of the input interface circuit with a CMOS structure.

Second Embodiment

Figure 2A:
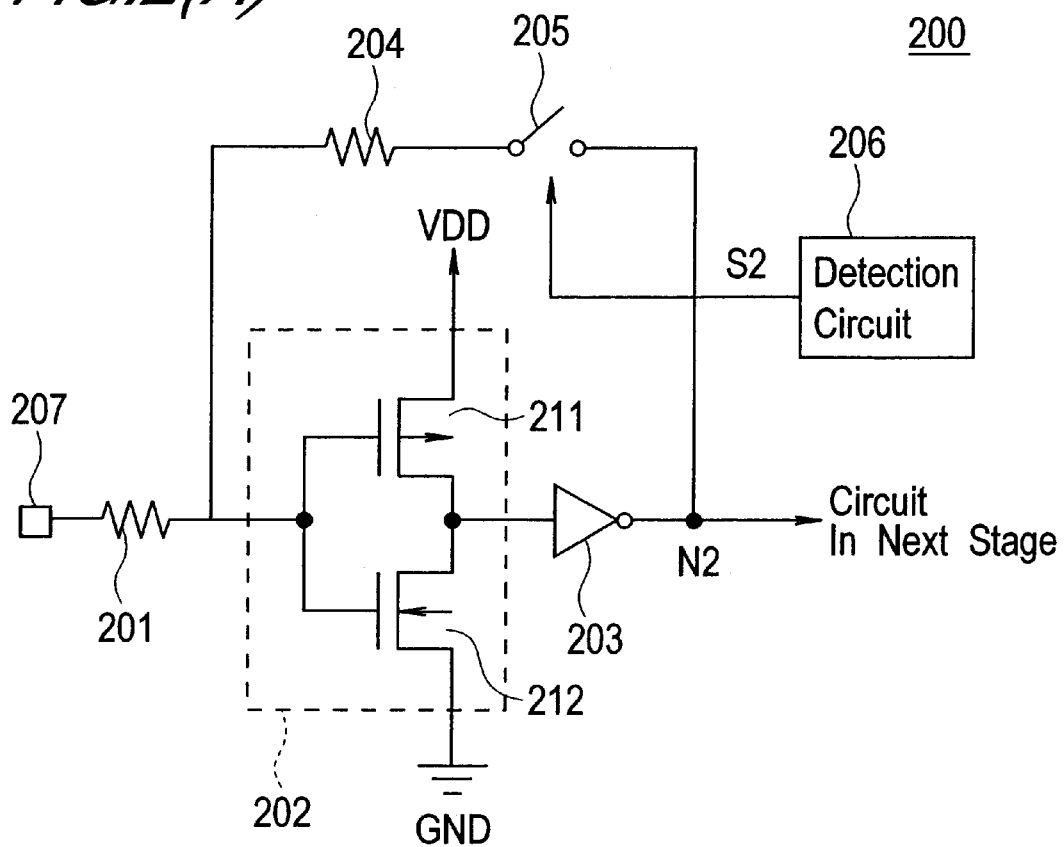
FIG. 2A is a circuit diagram depicting a configuration of an input interface circuit in accordance with a second embodiment.

FIG. 2A is a drawing depicting a configuration of an input interface circuit in accordance with a second embodiment of the present invention.

The input interface circuit 200 of the present embodiment comprises resistors 201, 204, inverters 202, 203, a switch 205, a power supply voltage detection circuit 206 and a signal input terminal 207. As FIG. 2A shows, the potential of the node N2 becomes the voltage signal to be output to the circuits in next stages.

One end of the resistor 201 is connected to the signal input terminal 207. The other end of the resistor 201 is connected to the input terminal of the inverter 202 and one end of the resistor 204. The output terminal of the inverter 202 is connected to the input terminal of the inverter 203, and the output terminal of the inverter 203 is connected to the node N2. The other end of the resister 204 is connected to one end of the switch 205, and the other end of the switch 205 is connected to the node N2.

The inverter 202 has a pMOS transistor 211 and an nMOS transistor 212 which are connected in a series. The source of the pMOS transistor 211 is connected to the power supply line VDD, and the source of the nMOS transistor 212 is connected to the ground line GND. The gates of the transistors 211 and 212 are connected to the other end of the resistor 201.

The internal configuration of the inverter 203 is the same as the internal configuration of the inverter 202.

The switch 205 opens when the detection signal S2 is at a high level, and closes when the signal S2 is at a low level.

The power supply voltage detection circuit 206 detects the power supply potential VDD and outputs a signal indicting the detection result. For the detection circuit 206, the same internal configuration as the detection circuit 105 (see FIG. 1B) can be used. Therefore, the detection signal S2 becomes a high level when the power supply potential VDD is at 5 volts, and becomes a low level when the power supply potential VDD is at 3 volts.

Operation of the input interface circuit 200 will now be described.

When the power supply potential VDD is at 5 volts, the signal S2 is at a high level, so the switch 205 opens. Therefore, the threshold value of the input interface circuit 200 is determined by the inverter 202. In other words, the threshold value is determined by the ratio of the on resistance of the pMOS transistor 211 and the on resistance of the nMOS transistor 212. As the on resistance of the pMOS transistor 211 gets smaller compared with the on resistance of the nMOS transistor 212, the threshold value increases.

Therefore, a desired threshold value can be obtained by appropriately setting the on resistance of the transistors 211 and 212 in the inverter 202.

When the power supply potential VDD is 3 volts, on the other hand, the signal S2 is at a low level, so the switch 205 closes. At this time, the input interface circuit 200 constitutes a Schmitt circuit. Therefore, the threshold value of the input interface circuit 200 has a hysteresis characteristic.

Figure 2B:
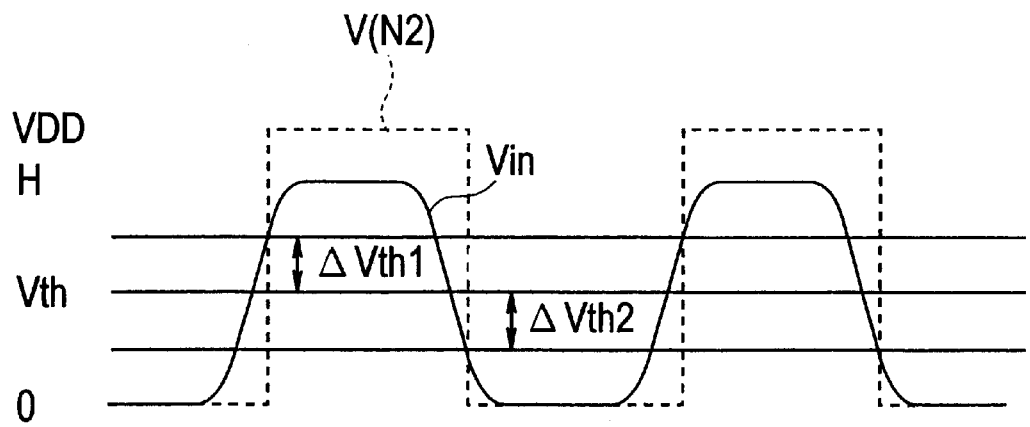
FIG. 2B is a waveform diagram depicting an operation of the circuit shown in FIG. 2A.

FIG. 2B is a waveform diagram depicting this hysteresis characteristic. In FIG. 2B, Vin is the potential of the input signal, and V (N2) is the potential of the node N2. Vth is a threshold value given by the inverter 202. In other words, Vth corresponds to the threshold value when the power supply potential VDD is 3 volts and when the switch 205 is closed.

When the signal voltage Vin is at a low level, the voltage V (N2) is at a low level. Since the voltage V (N2) remains at a low level when the signal voltage Vin starts rising, the input potential of the inverter 202 does not reach the same potential as the signal voltage Vin. In other words, the input potential of the inverter 202 rises more slowly than the signal voltage Vin. Therefore the actual threshold value when the signal voltage Vin rises from a low level to a high level is the value of $\Delta Vth1$ higher than Vth. When the signal voltage Vin reaches Vth+$\Delta Vth1$, the voltage V (N2) suddenly rises to a high level, that is, VDD. The value of $\Delta Vth1$ can be adjusted by the value of the current flowing through the resistor 204.

When the signal voltage Vin starts falling from the high level, the voltage V (N2) remains at the high level. Therefore the input potential of the inverter 202 falls more slowly than the signal voltage Vin. Because of this, the actual threshold value when the signal voltage Vin falls from the high level to the low level is the value of $\Delta Vth2$ lower than Vth. When the signal voltage Vin reaches Vth−$\Delta Vth2$, the voltage V (N2) suddenly falls to the low level, that is, 0 volts.

By providing a hysteresis characteristic to the circuit 200 by closing the switch 205, as mentioned above, the threshold value when a low level switches to a high level becomes substantially high. Therefore, even if the power supply potential VDD is set to 3 volts, the possibility of erroneously recognizing a low level signal as a high level signal due to a signal noise is small. The inverter 202 is designed such that the threshold value when VDD is 5 volts and the actual threshold value Vth+$\Delta Vth1$ when the VDD is 3 volts are within the allowable range of the threshold value for normal operation of the input interface circuit 200. This allowable range is selected according to the high level potential of the input signal.

As mentioned above, the input interface circuit 200 has a normal CMOS structure when VDD is 5 volts, and has a Schmitt structure when VDD is 3 volts. The input interface circuit can also be designed so as to have a Schmitt structure when VDD is 5 volts and have a normal CMOS structure when VDD is 3 volts. In the case of this input interface circuit, the possibility of erroneously recognizing a high level signal as a low level signal due to signal noise when VDD is 5 volts can be decreased. This is because, as FIG. 2B shows, the threshold value, when the high level switches to the low level, becomes Vth−$\Delta Vth2$. In this input interface circuit, the inverter at the first stage is designed such that the actual threshold value when VDD is 5 volts and the threshold value when VDD is 3 volts are within the allowable range of the threshold value for normal operation of the input interface circuit. This allowable range is selected according to the high level potential of the input signal.

Third Embodiment

Figure 3:
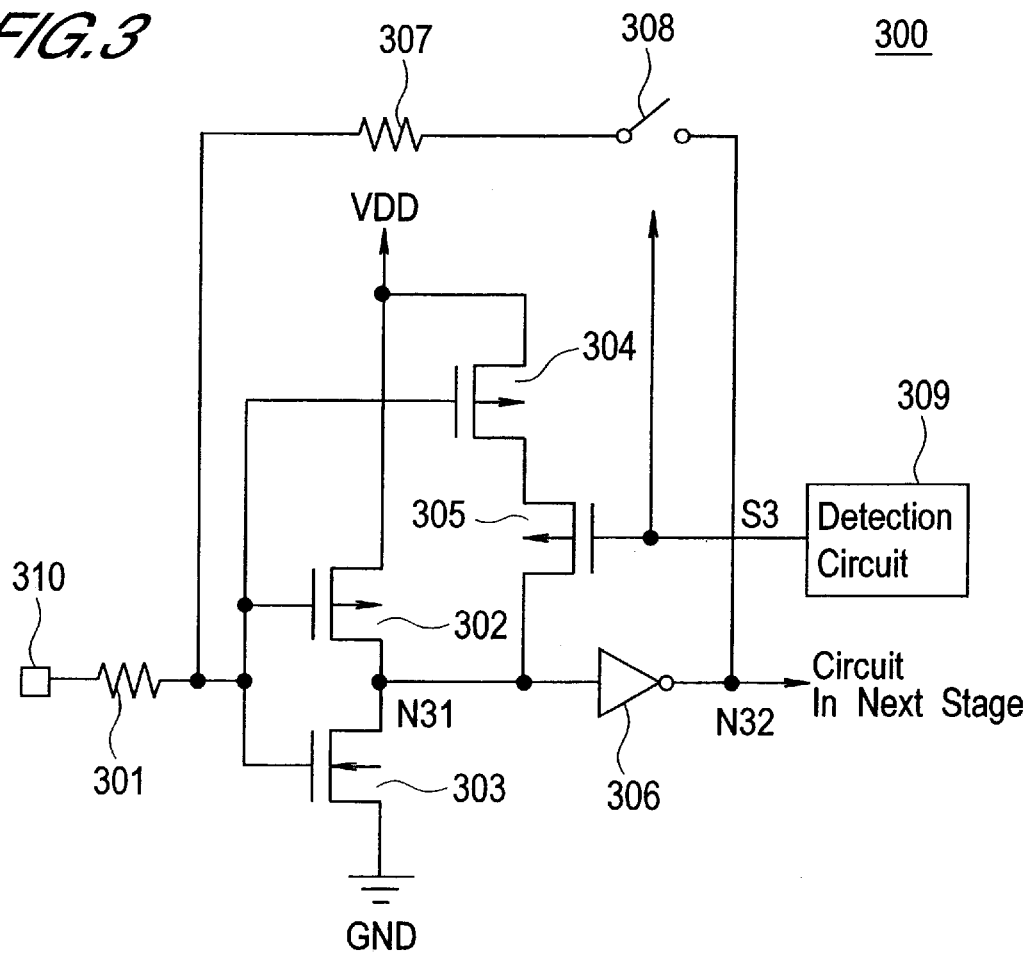
FIG. 3 is a circuit diagram depicting a configuration of an input interface circuit in accordance with a third embodiment.

FIG. 3 is a drawing depicting a configuration of an input interface circuit in accordance with the third embodiment of the present invention.

The input interface circuit 300 of this embodiment is created by combining the input interface circuit 100 of the first embodiment and the input interface circuit 200 of the second embodiment. As FIG. 3 shows, the potential of the node N32 becomes the voltage signal to be output to the circuit in the next stage.

One end of the resistor 301 is connected to the signal input terminal 310. The other end of the resistor 301 is connected to the gates of the pMOS transistors 302 and 304, the gate of the nMOS transistor 303 and one end of the resistor 307.

In the pMOS transistor 302, the source is connected to the power supply line VDD, and the drain is connected to the node N31.

In the nMOS transistor 303, the source is connected to the ground line GND, and the drain is connected to the node N31.

The source of the pMOS transistor 304 is connected to the power supply line VDD.

In the pMOS transistor 305, the source is connected to the drain of the pMOS transistor 304, and the drain is connected to the node N31.

In the inverter 306, the input terminal is connected to the node N31, and the output terminal is connected to the node N32.

The other end of the resistor 307 is connected to one end of the switch 308, and the other end of the switch 308 is connected to the node N32. The switch 308 opens when the detection signal S3 is at a high level, and closes when the signal S3 is at a low level.

The power supply voltage detection circuit 309 detects the value of the power supply potential VDD, and outputs the signal S3 which shows the detection result. In this embodiment, the power supply potential VDD is 3 volts or 5 volts. For the detection circuit 309 of this embodiment, a detection circuit having the same internal configuration as the detection circuit 105 (see FIG. 1B) can be used. The detection signal S3 is at a high level when the power supply potential VDD is at 5 volts, and at low level when the power supply potential VDD is at 3 volts.

Next the operation principle of the input interface circuit 300 will be described.

At first, the detection circuit 309 detects the power supply potential VDD in the same way as the first embodiment, and outputs the signal S3.

When the signal S3 is at a high level, that is, when the power supply potential VDD is at 5 volts, the pMOS transistor 305 turns off, and the switch 308 opens. Therefore, the threshold value of this input interface circuit 300 is determined by the ratio of the on resistance of the pMOS transistor 302 to the on resistance of the nMOS transistor 303. As the on resistance of the pMOS transistor 302 becomes smaller compared with the on resistance of the nMOS transistor 303, the threshold value increases. Therefore, a desired threshold value can be obtained by appropriately setting the on resistance of the transistors 302 and 303.

When the signal S3 is at a low level, that is, when the power supply potential VDD is at 3 volts, on the other hand, the pMOS transistor 305 turns on. Also in this case, the switch 308 closes, so the input interface circuit 300 constitutes a Schmitt circuit. Therefore, the actual threshold value of the input interface circuit 300 is given by Vth+$\Delta Vth1$, in the same way as the circuit 200 of the second embodiment (see FIG. 2B). Of Vth+ΔVth1, Vth is determined by the relationship of the on resistance of the transistors 302–305, and ΔVth1 is determined by the current value of the resistor 307.

In the case of the input interface circuit 300 of this embodiment, the threshold voltage when VDD is 5 volts and the threshold voltage when VDD is 3 volts can be independently set. Also the threshold value when VDD is 3 volts is determined by both the on resistances of the transistors 302–305 and the current value of the resistor 307. Since the input interface circuit 300 is more flexible in design than the input interface circuits of the first and second embodiments, design is easier.

Fourth Embodiment

Figure 4:
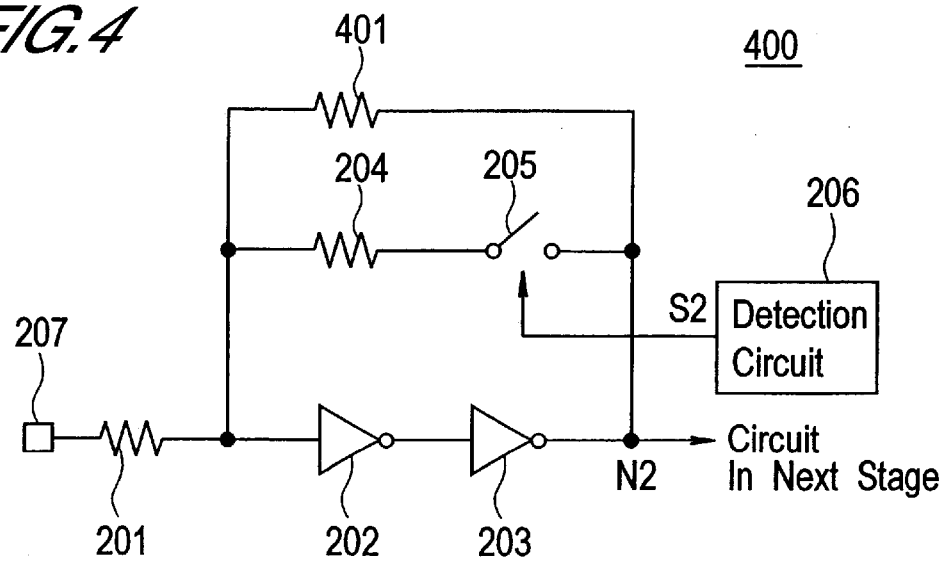
FIG. 4 is a circuit diagram depicting a configuration of an input interface circuit in accordance with a fourth embodiment.

FIG. 4 is a drawing depicting a configuration of an input interface circuit in accordance with a fourth embodiment of the present embodiment. In FIG. 4, composing elements which are the same as FIG. 2 are denoted with the same reference characters as FIG. 2.

The input interface circuit 400 has a resistor 401 which is different from the circuit 200 in the second embodiment.

One end of the resistor 401 is connected to the input terminal of the inverter 202, and the other end of the resistor 401 is connected to the output terminal of the inverter 203.

Next the operation of the input interface circuit 400 will be described.

The input interface circuit 400 always constitutes a Schmitt circuit, regardless the value of the power supply potential VDD, since the resistor 401 is disposed on the input interface circuit.

When the power supply potential VDD is 5 volts, the signal S2 is at a high level, so the switch 205 opens. Therefore, the resistance value of the positive feedback circuit included in the Schmitt circuit is determined only by the resistor 401. In this case, the actual threshold value of the input interface circuit 400 is indicated by Vth−ΔVth2 (see FIG. 2B). Of Vth−ΔVth2, Vth is determined by the ratio of the on resistance of the pMOS transistor in the inverter 202 to the on resistance of the nMOS transistor in the inverter 202. ΔVth2 is determined by the current value of the resistor 401.

When the power supply potential VDD is 3 volts, on the other hand, the signal S2 is at a low level, so the switch 205 closes. Therefore, the resistance value of the positive feedback circuit included in the Schmitt circuit is a combined resistance value of the resistors 401 and 204. In this case, the actual threshold value of the input interface circuit 400 is indicated by Vth+ΔVth1 (see FIG. 2B). Vth is determined by the ratio of the on resistance of the pMOS transistor in the inverter 202 to the on resistance of the nMOS transistor in the inverter 202. ΔVth1 is determined by the sum of the current value of the resistor 401 and the current value of the resistor 204.

In the case of the input interface circuit 400 of this embodiment, the threshold value when VDD is 5 volts and the threshold value when VDD is 3 volts can be individually set. This threshold value can also be determined by both the on resistance of the transistor constituting the inverter 202 and the current values of the resistors 401 and 204. Since the input interface circuit 400 is more flexible in design than the input interface circuits of the above embodiments, design is easier.

Fifth Embodiment

Figure 5A:
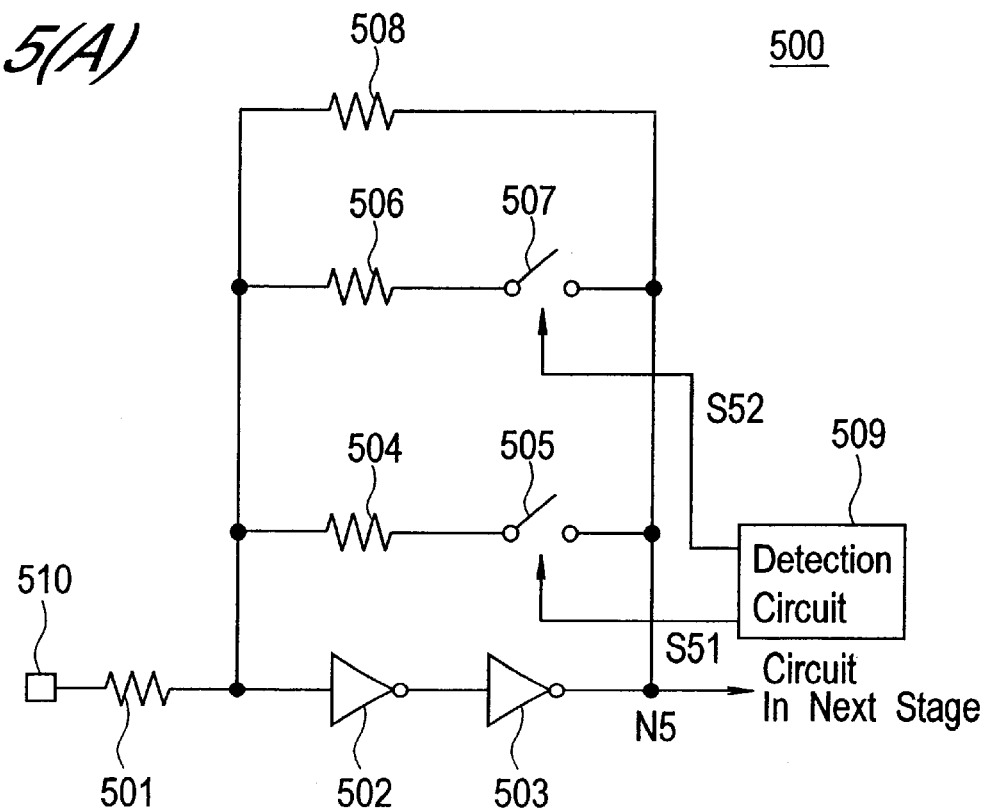
FIG. 5A is a circuit diagram depicting a configuration of an input interface circuit in accordance with a fifth embodiment.

FIG. 5A is a drawing depicting a configuration of an input interface circuit in accordance with the fifth embodiment of the present invention.

The input interface circuit 500 of the present embodiment comprises resistors 501, 504, 506 and 508, inverters 502 and 503, switches 505 and 507, a power supply voltage detection circuit 509, and a signal input terminal 510. As FIG. 5A shows, the potential of the node N5 becomes the voltage signal to be output to the circuit in next stages.

One end of the resistor 501 is connected to the signal input terminal 510. The other end of the resistor 501 is connected to the input terminal of the inverter 502, and to one end of the resistors 504, 506 and 508.

The output terminal of the inverter 502 is connected to the input terminal of the inverter 503, and the output terminal of the inverter 503 is connected to the node N5. The internal configuration of the inverters 502 and 503 is the same as the internal configuration of the inverter 202 shown in FIG. 2.

The other end of the resistor 504 is connected to one end of the switch 505, and the other end of switch 505 is connected to the node N5. The switch 505 opens when the detection signal S51 is at a high level, and closes when the signal S51 is at a low level.

The other end of the resistor 506 is connected to one end of the switch 507, and the other end of the switch 507 is connected to the node N5. The switch 507 opens when the detection signal S52 is at a high level, and closes when the signal S52 is at a low level.

The other end of the resistor 508 is connected to the node N5.

The power supply voltage detection circuit 509 detects the power supply potential VDD, and outputs signals S51 and S52 which show the detection result. In this embodiment, the power supply potential VDD is 3 volts, 4 volts or 5 volts.

Figure 5B:
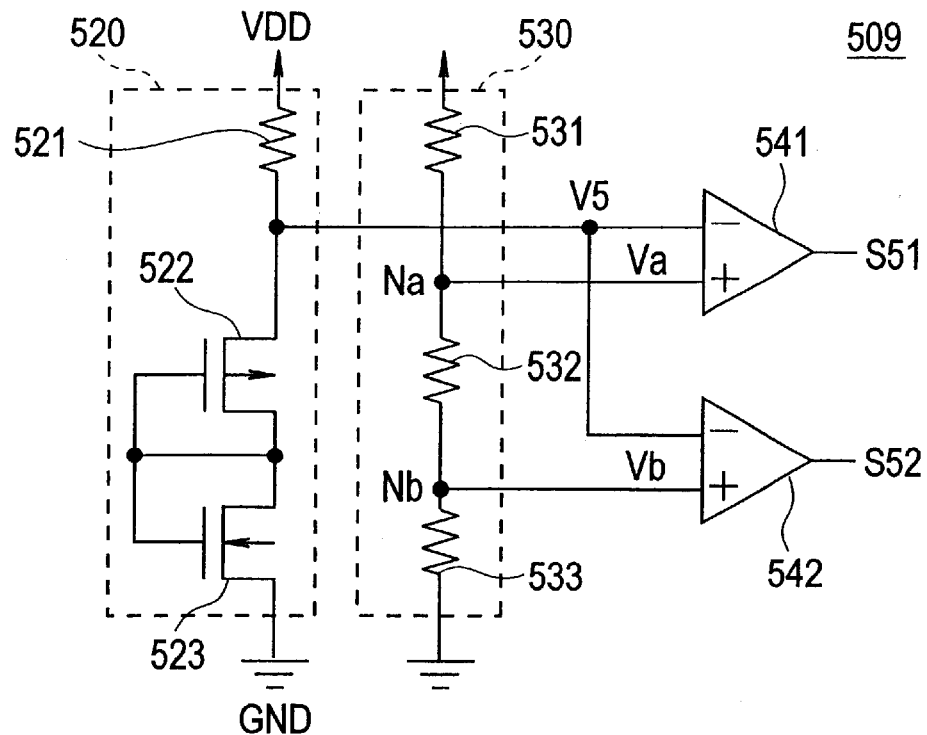
FIG. 5B is a circuit diagram depicting an internal configuration of the power supply voltage detection circuit shown in FIG. 5A.

FIG. 5B is a circuit diagram depicting an example of the internal configuration of the power supply voltage detection circuit 509.

As FIG. 5B shows, the power supply voltage detection circuit 509 comprises a constant voltage circuit 520, a resistance type potential dividing circuit 530 and comparators 541 and 542.

The constant voltage circuit 520 has a resistor 521, a pMOS transistor 522 and an nMOS transistor 523. One end of the resistor 521 is connected to the power supply line VDD. The source of the pMOS transistor 522 is connected to the other end of the resistor 521. The gate of the pMOS transistor 522 is connected to the drain of the pMOS transistor 522, the gate of the nMOS transistor 523, and the drain of the nMOS transistor 523. The source of the nMOS transistor 523 is connected to the ground line GND.

The resistance type potential dividing circuit 530 has three resistors, 531, 532 and 533, which are connected in a series between the power supply line VDD and the ground line GND. In the following description, the node between the resistor 531 and resistors 532 is Na, and the node between the resistor 532 and resistor 533 is Nb.

The comparator 541 inputs the source potential V5 of the pMOS transistor 522 from the minus input terminal, and inputs the potential Va of the node Na from the plus input terminal. The output signal of the comparator 541 is applied to the switch 505 as the detection signal S51.

The comparator 542 inputs the source potential V5 of the pMOS transistor 522 from the minus input terminal, and inputs the potential Vb of the node Nb from the plus input terminal. The output signal of the comparator 542 is applied to the switch 507 as the detection signal S52.

Next the operation principle of the input interface circuit 500 will be described.

At first the detection circuit 509 detects the power supply potential VDD as follows.

The constant voltage circuit 520 always outputs a constant voltage V5 regardless the power supply potential VDD. In this embodiment, V5 is 1.5 volts. The resistance type potential dividing circuit 530 divides the power supply potential VDD according to the resistance ratio of the resistors 531–533. In this embodiment, the resistance ratio of the resistors 531–533 is assumed to be 5:1:3. Therefore, when the power supply potential VDD is 5 volts, the node Na is 2.2 volts and the node Nb is 1.7 volts. When the power supply potential VDD is 4 volts, the node Na is 1.8 volts, and the node Nb is 1.3 volts. When the power supply potential VDD is 3 volts, the node Na is 1.3 volts and the node Nb is 1 volt. The comparator 541 sets the output signal S51 at a high level when the potential of the node Na is greater than V5, and sets the output signal S51 at a low level when the potential of the node Na is smaller than V5. The comparator 542 sets the output signal S52 at a high level when the potential of the node Nb is greater than V5, and sets the output signal S52 at a low level when the potential of the node Nb is smaller than V5. Therefore, when the power supply potential VDD is 5 volts, both S51 and S52 become a high level. When the power supply potential VDD is 4 volts, S51 becomes a high level and S52 becomes a low level. When the power supply potential VDD is 3 volts, both S51 and S52 become a low level.

When the power supply potential VDD is 5 volts, the signals S51 and S52 are at a high level, so the switches 505 and 507 are both open. Therefore, the resistance value of the positive feedback circuit included in the Schmitt circuit 500 is determined by the resistor 508 only. The actual threshold value in this case is determined by the on resistance of the two transistors constituting the inverter 502 and the current value of the resistor 508.

When the power supply potential VDD is 4 volts, S51 is at a high level and S52 is at a low level, so the switch 505 opens and the switch 507 closes. Therefore, the resistance value of the positive feedback circuit included in the Schmitt circuit is the combined resistance value of the resistors 506 and 508. The actual threshold value in this case is determined by the on resistance of the two transistors constituting the inverter 502 and the combined resistance value of the resistors 506 and 508. Since the resistors 506 and 508 are connected in parallel, this combined resistance value is smaller than the resistance value of the resistor 508.

When the power supply potential is 3 volts, S51 and S52 are at low level, so the switches 505 and 507 both close. Therefore, the resistance value of the positive feedback circuit included in the Schmitt circuit is the sum of the current values of the resistors 504, 506 and 508. The actual threshold value in this case is determined by the on resistance of the two transistors constituting the inverter 502 and the current values of the resistors 504, 506 and 508. Since the resistors 504, 506 and 508 are connected in parallel, the combined resistance value is smaller than the combined resistance value of the resistors 506 and 508.

As described above, the input interface circuit 500 of this embodiment can set three types of threshold voltage.

Also, this threshold value can be determined by the on resistance of the transistors constituting the inverter 502 and the current values of the resistors 504, 506 and 508, so flexibility in design is high.

By connecting the resistance circuit the same as the resistor 401 of the fourth embodiment to the input interface circuit 300 of the third embodiment, an input interface circuit having a hysteresis characteristic when the power supply potential VDD is 5 volts can be created.

By connecting the circuit comprising the resistors 406, 508 and switch 507 of the fifth embodiment to the input interface circuit 300 of the third embodiment, an input interface circuit which can use three types of power supply potential VDD can be created.

What is claimed is:

1. An input interface circuit comprising:
    a comparator that compares a potential level of a signal input from a signal input terminal with a threshold value and that outputs a comparison result via a signal output terminal;
    a detector that detects a power supply potential supplied to the comparator; and
    a controller that controls the threshold value of the comparator based on the detected power supply potential,
    wherein the comparator includes
        a first conductive type first transistor having one end connected to a first power supply line, another end connected to the signal output terminal, and a control terminal connected to the signal input terminal, and
        a second conductive type second transistor having one end connected to
    a second power supply line, another end coupled to the signal output terminal
    and a control terminal connected to the signal input terminal, and
    wherein the controller includes a resistance circuit that connects the first power supply line to the signal output terminal when a predetermined potential is detected by the detector and the first transistor is on,
    wherein the resistance circuit includes
        a first conductive type third transistor, disposed between the first power supply line and the signal output terminal, having a control terminal connected to the signal input terminal, and
        a fourth transistor, connected to the third transistor in series, having a control terminal at which the detected power supply potential is input thereto.

2. The input interface circuit according to claim 1, wherein the detector comprises:
    a first constant voltage circuit that outputs a constant voltage;
    a first potential dividing circuit that divides the power supply potential; and
    a first comparator that compares the constant voltage output from the first constant voltage circuit with the divided voltage provided by the first potential dividing circuit.

3. An input interface circuit comprising:
    a comparator that compares a potential level of a signal input from a signal input terminal with a threshold value and that outputs a comparison result via a signal output terminal;
    a detector that detects a power supply potential supplied to the comparator; and
    a controller that controls the threshold value of the comparator based on the detected power supply potential,
    wherein the comparator includes first and second inverters which are connected in series between the signal input terminal and the signal output terminal.

4. The input interface circuit according to claim 3, wherein the detector comprises:
    a first constant voltage circuit that outputs a constant voltage;
    a first potential dividing circuit that divides the power supply potential; and a first comparator that compares the constant voltage output from the first constant voltage circuit and the divided voltage provided by the first potential dividing circuit.

5. The input interface circuit according to claim 4, wherein the controller is a positive feedback circuit that provides a hysteresis characteristic to the threshold value of the comparator.

6. The input interface circuit according to claim 5, wherein said positive feedback circuit comprises:
  a first resistor having a first terminal connected to an input of said first inverter; and
  a first switch, having a first terminal connected to a second terminal of said first resistor and having a second terminal connected to an output of said second inverter, that opens/closes according to the detected power supply potential.

7. The input interface circuit according to claim 5, wherein said positive feedback circuit comprises:
  a first resistor having a first terminal connected to an input of said first inverter;
  a first switch, having a first terminal connected to a second terminal of said first resistor and having a second terminal connected to an output of said second inverter, that opens/closes according to the detected power supply potential; and
  a second resistor which is disposed between the output of said second inverter and the input of said first inverter in parallel with said first resistor and said first switch.

8. The input interface circuit according to claim 3, wherein said detector comprises:
  a first constant voltage circuit that outputs a constant voltage;
  a first potential dividing circuit that divides the power supply potential into a first divided voltage and a second divided voltage;
  a first comparator that compares the constant voltage and the first divided voltage; and
  a second comparator that compares the constant voltage and the second divided voltage.

9. The input interface circuit according to claim 8, wherein the controller is a positive feedback circuit that provides a hysteresis characteristic to the threshold value of said comparator.

10. The input interface circuit according to claim 9, wherein said positive feedback circuit comprises:
  a first resistor having a first terminal connected to an input of said first inverter;
  a first switch, having a first terminal connected to a second terminal of said first resistor and having a second terminal connected to an output of said second inverter, that opens/closes according to an output voltage of said first comparator;
  a second resistor having a first terminal connected to an input of said first inverter;
  a second switch, having a first terminal connected to a second terminal of said second resistor and having a second terminal connected to an output of said second inverter, that opens/closes according to an output voltage of said second comparator; and
  a third resistor which is disposed between the output of said second inverter and the input of said first inverter in parallel with said second resistor and said second switch.

11. An input interface circuit comprising:
  a comparator that compares a potential level of a signal input from a signal input terminal with a threshold value and that outputs a comparison on result via a signal output terminal;
  a detector that detects a power supply potential supplied to the comparator; and
  a controller that controls the threshold value of the comparator based on the detected power supply potential,
  wherein the comparator includes
    a transistor circuit comprised of a first conductive type first transistor having one end connected to a first power supply line and a control terminal connected to the signal input terminal, and a second conductive type second transistor having one end connected to a second power supply line, another end connected to another end of said first transistor, and a control terminal connected to the signal input terminal, and
    a first inverter disposed between the another end of said first transistor and the signal output terminal.

12. The input interface circuit according to claim 11, wherein the detector comprises:
  a first constant voltage circuit that outputs a constant voltage;
  a first potential dividing circuit that divides the power supply potential; and
  a first comparator that compares the constant voltage output from the first constant voltage circuit and the divided voltage provided by the first potential dividing circuit.

13. The input interface circuit according to claim 12, wherein the controller comprises:
  a resistance circuit that connects the first power supply line and the signal output terminal when a predetermined potential is detected by the detector and the first transistor is on; and
  a positive feedback circuit that provides a hysteresis characteristic to the comparator.

14. The input interface circuit according to claim 13, wherein said resistance circuit comprises:
  a first conductive type third transistor having a first end connected to the first power supply line and a control terminal connected to the signal input terminal; and
  a fourth transistor having a first end connected to a second end of said third transistor and a control terminal to which the detected power supply potential is coupled.

15. The input interface circuit according to claim 13, wherein said positive feedback circuit comprises:
  a first resistor having a first terminal connected to an input of said transistor circuit; and
  a first switch, having a first terminal connected to a second terminal of said first resistor and having a second terminal connected to an output of said first inverter, that opens/closes according to the detected power supply potential.

16. An input interface circuit comprising:
  an input terminal and an output terminal;
  an inverter, connected between said input terminal and said output terminal, having a first transistor of a first conductive type and a second transistor of a second conductive type, said first transistor being connected between a power supply line and said output terminal, and said second transistor being connected between a ground line and said output terminal;

a control circuit, connected between the power supply line and said output terminal, having a third transistor of the first conductive type and a fourth transistor of the second conductive type, said third and fourth transistors being connected in series between the power supply line and the output terminal, and a control terminal of said third transistor being connected to said input terminal; and a detection circuit that detects a charge of said power supply line and controls conduction of said fourth transistor based on the detected charge.

17. The input interface circuit according to claim 16, wherein said detection circuit comprises:

a constant voltage circuit that outputs a constant voltage;

a potential dividing circuit that divides a potential power at the supply line; and a comparator that compares the constant voltage output by said constant voltage circuit with the divided potential provided by said potential dividing circuit.

* * * * *